(12) United States Patent
Lee et al.

(10) Patent No.: US 7,365,000 B2
(45) Date of Patent: Apr. 29, 2008

(54) METHOD FOR FABRICATING SEMICONDUCTOR DEVICE

(75) Inventors: Sung-Kwon Lee, Ichon-shi (KR); Min-Suk Lee, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 387 days.

(21) Appl. No.: 10/876,783

(22) Filed: Jun. 28, 2004

(65) Prior Publication Data
US 2005/0112869 A1    May 26, 2005

(30) Foreign Application Priority Data
Nov. 21, 2003   (KR) .................... 10-2003-0083168

(51) Int. Cl.
*H01L 21/4763* (2006.01)
*H01L 21/76* (2006.01)
(52) U.S. Cl. .................... 438/618; 257/E21.228
(58) Field of Classification Search ........... 438/618; 257/E21.228
See application file for complete search history.

(56) References Cited

U.S. PATENT DOCUMENTS

| 5,631,197 | A | | 5/1997 | Yu et al. | |
|---|---|---|---|---|---|
| 5,665,657 | A | | 9/1997 | Lee | |
| 5,989,983 | A | * | 11/1999 | Goo et al. | 438/473 |
| 6,030,932 | A | * | 2/2000 | Leon et al. | 510/175 |
| 6,207,585 | B1 | * | 3/2001 | Hasegawa et al. | 438/763 |
| 6,242,331 | B1 | * | 6/2001 | Chu et al. | 438/586 |
| 6,479,399 | B2 | * | 11/2002 | Park et al. | 438/738 |
| 6,524,964 | B2 | * | 2/2003 | Yu | 438/736 |
| 6,649,503 | B2 | * | 11/2003 | Kim et al. | 438/595 |
| 6,693,050 | B1 | * | 2/2004 | Cui et al. | 438/782 |
| 6,699,746 | B2 | * | 3/2004 | Chung et al. | 438/239 |
| 6,933,236 | B2 | * | 8/2005 | Lee et al. | 438/695 |
| 2004/0082162 | A1 | * | 4/2004 | Kang et al. | 438/629 |

FOREIGN PATENT DOCUMENTS

KR   10-2003-0049138 A   6/2003

* cited by examiner

*Primary Examiner*—Michael Lebentritt
*Assistant Examiner*—Thu-Huong Dinh
(74) *Attorney, Agent, or Firm*—McDermott Will & Emery LLP

(57) ABSTRACT

Disclosed is a method for fabricating a semiconductor device capable of preventing an inter-layer insulation layer from being damaged during a wet cleaning process due to a density difference created by reliance on a thickness of a SOG layer subjected to a curing process and of overcoming defects caused by an improper contact opening in a certain region and a punch taken place by micro voids of an APL layer. Particularly, the method includes the steps of: forming a plurality of conductive structure on a substrate; forming a spin-on-glass layer; curing the spin-on-glass layer; forming an advanced-planarization-layer on the spin-on-glass layer; and forming a plurality of contact holes by selectively etching the advanced-planarization-layer and the spin-on-glass layer, thereby exposing portions of the substrate.

13 Claims, 9 Drawing Sheets

ILD 3

ILD 4

METHOD FOR FABRICATING SEMICONDUCTOR DEVICE

FIELD OF THE INVENTION

The present invention relates to a method for fabricating a semiconductor device; and more particularly, to a method for fabricating a self-aligned contact of a semiconductor device.

DESCRIPTION OF RELATED ARTS

A trend in a Large-scale of integration has brought a need to form semiconductor devices densely within a confined cell region. Thus, the size of unit devices of a semiconductor device, for instance, transistors and capacitors, has been gradually decreased. Particularly, in a dynamic random access memory (DRAM) device, the size of the unit devices formed within a cell region has been decreased as the design rule has been shifted towards minimization. For instance, DRAM devices are currently formed to have a minimum linewidth less than 0.1 μm and are often required to have a linewidth less than 80 nm. Hence, there exist many difficulties in applying conventional fabrication methods.

In case of applying a photolithography using ArF having a wavelength of 193 nm to a semiconductor device having a linewidth less than 80 nm, it is necessary to develop an additional recipe for preventing a photoresist deformation created during an etching process employed for the purposes of forming a fine pattern and a vertical etch profile.

Meanwhile, advancement in an integration level of a semiconductor device has led device elements to be formed in stacks. A contact plug or a contact pad is one example of such stack structure.

For the contact plug, a landing plug contact (LPC) is commonly used since the LPC has a bottom portion which makes a wide contact within a minimum area and a top portion which is wider than the bottom portion for increasing a contact margin.

A self-aligned contact (SAC) etching process is required to form such a LPC. The SAC etching process is a method of forming a contact by carrying out an etching process to a bottom semiconductor structure having a specific etch selectivity ratio. Generally, the SAC etching process uses materials e.g., nitride and oxide having a different etch selectivity ratio.

Recent trends in large-scale of integration and minimization of the design rule make a distance between conductive patterns such as gate electrodes decreased, but a thickness of a conductive pattern conversely increased. As a result, an aspect ratio representing a ratio between a height and a width of a conductive pattern has been gradually augmented.

Therefore, it is required to develop a method for filling empty spaces generated by a high aspect ratio between the conductive patterns. For instance, borophosphosilicate glass (BPSG) is employed for such purpose since BPSG has an excellent gap filling property. However, since BPSG requires a high thermal flow process proceeding at a temperature greater than 800° C., there arises a problem that the BPSG is diffused into lateral sides.

One of developing methods for resolving the above problem is a flowfill process which employs a flowable insulation layer. Examples of the flowable insulation layer are an advanced planarization layer (APL) and a spin on glass (SOD) layer, which is also called a spin on dielectric (SOD) layer.

For the SOG layer, it has a good gap fill property. However, it is essential to densify the SOG layer through a curing process at a temperature ranging from 600° C. to 700° C. A bottom part of the SOG layer is not sufficiently densified, thereby being susceptible to a wet cleaning process performed after a contact formation process.

This problem will be described in detail with reference to the accompanying drawings.

FIGS. 1A and 1B are photographs of scanning electron microscopy (SEM) in a top view for comparing a conventional BPSG layer with a conventional SOG layer each obtained after a SAC etching process.

Particularly, FIG. 1A is a top view of the BPSG layer formed as a first inter-layer insulation layer ILD1, while FIG. 1B is a cross-sectional view of the SOG layer formed as a second inter-layer insulation layer ILD2. Also, FIGS. 1A and 1B respectively show contact holes C1 and C2 formed after the SAC etching process.

FIGS. 2A and 2B are photographs of SEM in a cross-sectional view for comparing a conventional BPSG layer with a conventional SOG layer after a wet cleaning process performed after a SAC etching process.

Particularly, FIG. 2A is a cross-sectional view showing the conventional BPSG layer taken along a line A-A' of FIG. 1A. As shown, there are not observed damages in the BPSG layer, which is a first inter-layer insulation layer ILD1, during the wet cleaning process using buffered oxide etchant (BOE) solution. Herein, the wet cleaning process is followed by the SAC etching process in order to secure a critical dimension (CD) of a bottom area of a contact and remove etch remnants.

FIG. 2B is a cross-sectional view showing the conventional SOG layer taken along a direction of a line B-B' of FIG. 1B. As shown, a bottom portion of a second inter-layer insulation layer ILD2, i.e., the SOG layer, which is partially cured, is easily damaged during the wet cleaning process since the bottom portion is not sufficiently densified. The reference denotation A expresses the damage created during the wet cleaning process. However, a top portion of the SOG layer is almost intact. A thickness T of the SOG layer that can be completely cured is 4000 Å.

FIGS. 3A and 3B are photographs of SEM in a top view for comparing a conventional BPSG layer with a conventional SOG layer obtained after a plug formation process.

Particularly, FIG. 3A is a cross-sectional view showing the conventional BPSG layer used as a first inter-layer insulation layer ILD1. A conductive layer, e.g., a polysilicon layer, is deposited on a substrate structure including a contact hole formed by etching the inter-layer insulation layer ILD1 and is subsequently subjected to a chemical mechanical polishing (CMP) process. From this. CMP process, a plurality of plugs P1 is formed. In case of employing the BPSG layer as the first inter-layer insulation layer ILD1, there are not problems of an electric short between the plugs P1 and degradation of an insulation property since the first inter-layer insulation layer ILD1 is not affected by a wet cleaning process.

FIG. 3B is a cross-sectional view showing the conventional SOG layer used as a second inter-layer insulation layer ILD2. As shown, a bottom portion of the second inter-layer insulation layer ILD2, i.e., the SOG layer, is damaged by a wet cleaning process, and this damaged portion of the bottom portion of the second inter-layer insulation layer ILD2 deteriorates an insulation property of the second inter-layer insulation layer ILD2 disposed between plugs P2. There may be a problem of an electric short between the plugs P2 if this damage becomes more severe.

Therefore, it is necessitated to develop a method for preventing an inter-layer insulation layer, e.g., the SOG layer, from being damaged by a wet cleaning process since there is generated a difference in density caused by a limitation in curing the SOG layer up to a certain thickness.

An attempt to improve a gap fill property is made by depositing the SOG layer and a silicon dioxide layer in double (referring to U.S. Pat. No. 6,479,399). However, in the above case, the gap fill property of the silicon dioxide layer being deposited on the SOG layer is very weak and the curing process proceeded after etching back the SOG layer is very complicated. Also, the gap fill property is very weak in a region of a surrounding circuit.

On the other hand, the APL layer is more tolerant to a wet cleaning process or a wet etching process comparing to the SOG layer.

FIGS. 4A and 4B are photographs of SEM in a cross-sectional view for comparing a conventional SOG layer with a conventional APL layer obtained after a SAC etching process and wet cleaning process.

Referring to FIG. 4A, there are not observed damages in the BPSG layer, which is a third inter-layer insulation layer ILD3, during the wet cleaning process using buffered oxide etchant (BOE) solution. Herein, the wet cleaning process is followed by the SAC etching process in order to secure a critical dimension (CD) of a bottom area of a contact and remove etch remnants.

Referring to FIG. 4B, a bottom portion of a fourth inter-layer insulation layer ILD4, i.e., the SOG layer, which is partially cured, is easily damaged during the wet cleaning process since the bottom portion is not sufficiently densified. However, a top portion of the SOG layer is almost intact. On the other hand, a top portion of the SOG layer is almost intact such as 'T' shown in FIG. 2B. Referring to FIG. 4B, a thickness of the SOG layer that can be completely cured is approximately 4000 Å from the top portion of the inter-layer insulation layer (ILD4).

As for the APL layer, the gap fill property is very good. However, the APL layer has a disadvantage. That is, there can be produced micro voids when depositing a thin layer in a region having a narrow spacing, i.e., a bottom portion of the contact hole due to a property of a material of the APL itself.

FIGS. 5A to 5B are cross-sectional views illustrating micro voids produced when depositing a conventional APL layer and punches on a bottom portion of the APL layer due to micro voids when an etching process is performed, respectively.

Referring to FIG. 5A, a plug 501 is formed on the substrate 500. A first interlayer insulation layer 502 is formed on the plug 501. A plurality of bit lines formed by sequentially stacking a conductive layer and a hard mask is formed on the first interlayer insulation layer 502. An etch stop layer 505 being made up of a nitride layer-based material is formed along the profile of the bit line. A second interlayer insulation layer 506 being made of the APL layer with a good gap fill property is formed on the above resulting structure. As illustrated in the above, there is formed the micro voids 507 in a narrow region between the plurality of bit lines due to the property of the APL layer itself.

Referring to FIG. 5B, a contact hole 509 for exposing the plug 501 is formed between the plurality of bit lines through a SAC etching process for forming SNC.

On the other hand, the micro voids 507 cannot be subjected to the etching process applying a normal SAC recipe, rather remain the undesirable APL. If the SAC etching process is performed excessively to prevent remaining the undesirable APL layer, the plurality of punches 508 are taken place. The punches 508 damage even the plug 501 below the first interlayer insulation layer 502.

The punches 508 are taken place on the top portion of the plug 501 through the etch stop layer 505 by an excessive etching process for preventing a phenomenon not being completely etched in a certain region due to the APL layer.

In case of the etching process is not excessively proceeded to prevent producing the plurality of punches, the phenomenon not being completely etched in a certain region due to the APL layer is happened.

In order to prevent damages on the bottom portion of the etch stop layer caused by the excessive SAC etching process and the phenomenon not being completely etched in a certain region caused by the micro voids of the APL layer, a special wet or dry cleaning process can be proceeded after the SAC etching process for removing the remaining APL layer.

However, although the phenomenon not being completely etched in a certain region is improved through the special cleaning process, there can be damages on the top portion of the insulation layer. And the insulation property is deteriorated because an opening unit of the contact hole is expanded. The opening unit of the contact hole also causes another problem that reduces an overlap margin generated during a subsequent process.

SUMMARY OF THE INVENTION

It is, therefore, an object of the present invention to provide a method for fabricating a semiconductor device capable of preventing an inter-layer insulation layer from being damaged during a wet cleaning process due to a difference in density created by reliance on a thickness of a SOG layer subjected to a curing process and of overcoming defects caused by an improper contact opening in a certain region and a plurality of punches taken place by micro voids of an APL layer.

In accordance with an aspect of the present invention, there is provided a method for fabricating a semiconductor device, including the steps of: forming a plurality of conductive structure on a substrate; forming a spin-on-glass layer; curing the spin-on-glass layer; forming an advanced-planarization-layer on the spin-on-glass layer; and forming a plurality of contact holes by selectively etching the advanced-planarization-layer and the spin-on-glass layer, thereby exposing portions of the substrate.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, a method for fabricating a semiconductor device capable of preventing damages by a wet cleaning process in accordance with a preferred embodiment of the present invention will be described in detail with reference to the accompanying diagrams.

Figure 1A:
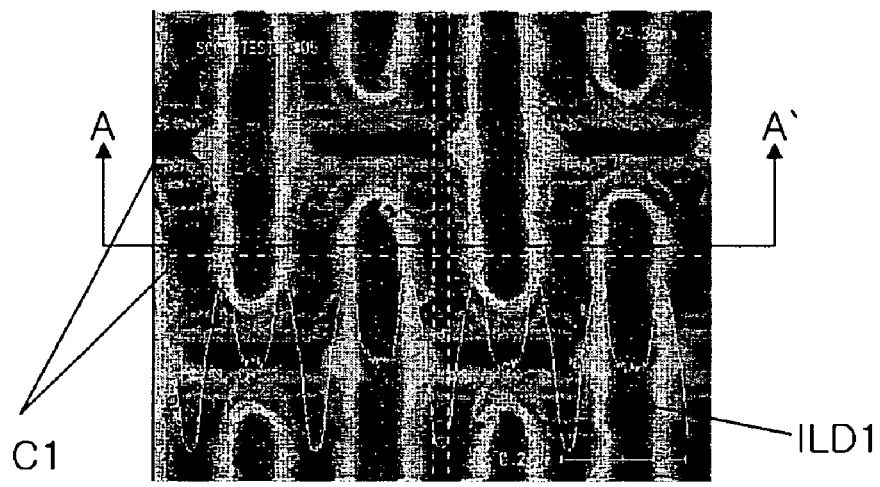
FIGS. 1A and 1B are photographs of scanning electron microscopy (SEM) in a top view for comparing a conventional BPSG layer with a conventional SOG layer each obtained after a SAC etching process.
Figure 1B:
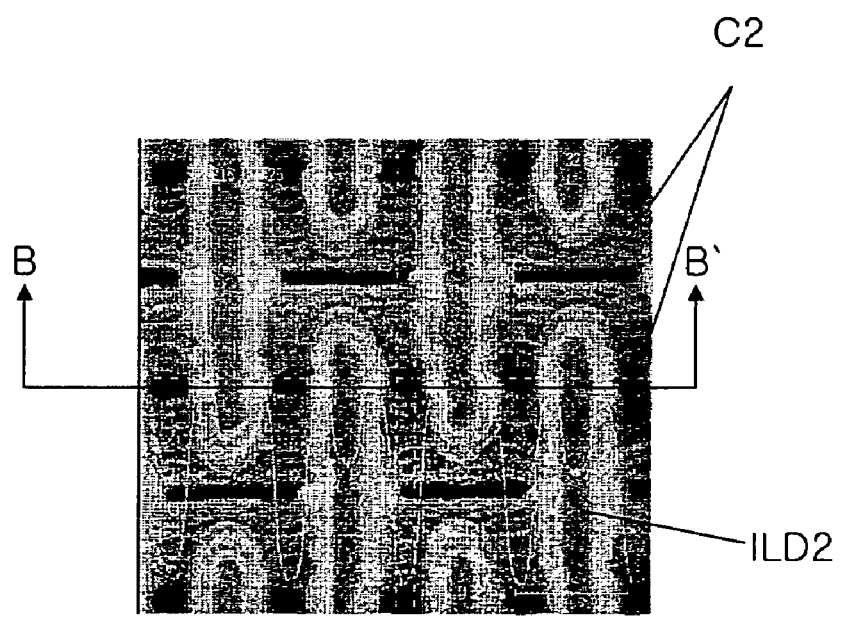
Figure 2A:
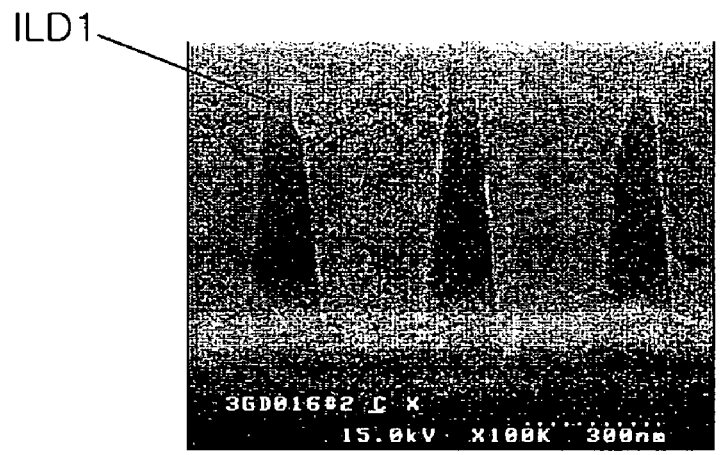
FIGS. 2A and 2B are photographs of SEM in a top view for comparing a conventional BPSG layer with a conventional SOG layer after a wet cleaning process performed after a SAC etching process.
Figure 2B:
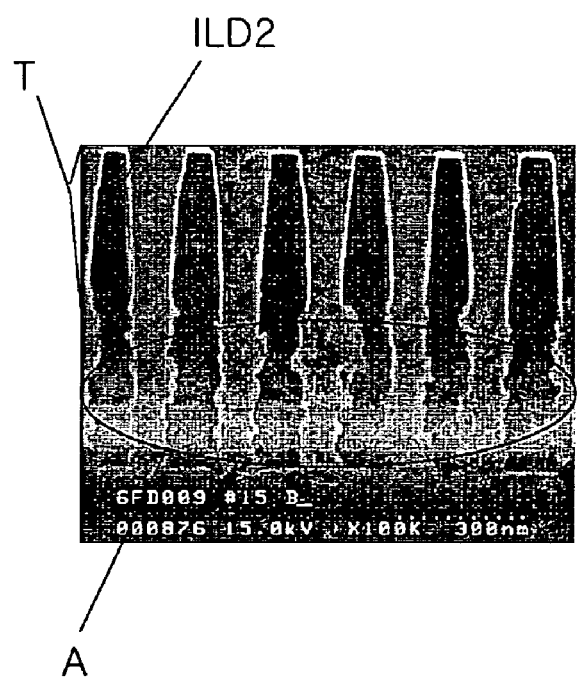
Figure 3A:
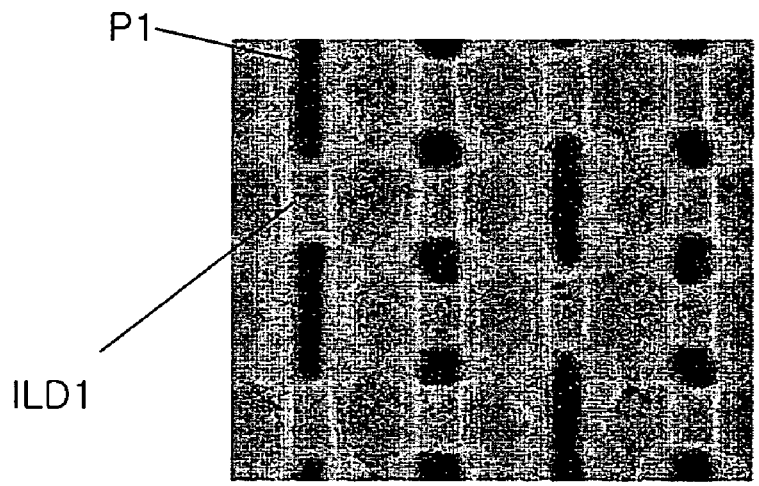
FIGS. 3A and 3B are photographs of SEM in a top view for comparing a conventional BPSG layer with a conventional SOG layer obtained after a plug formation process.
Figure 3B:
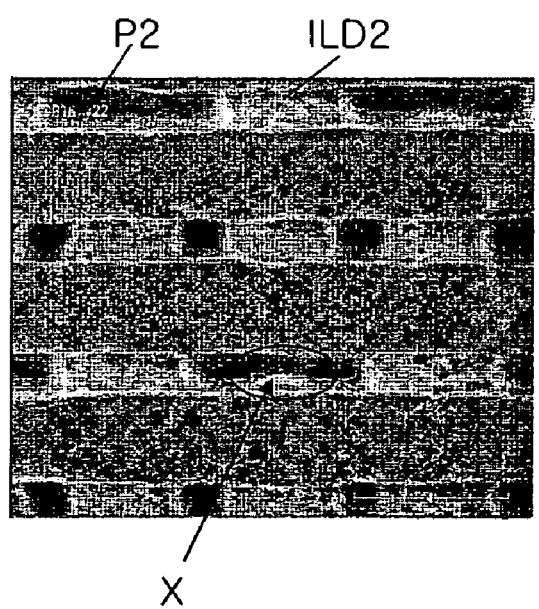
Figure 4A:
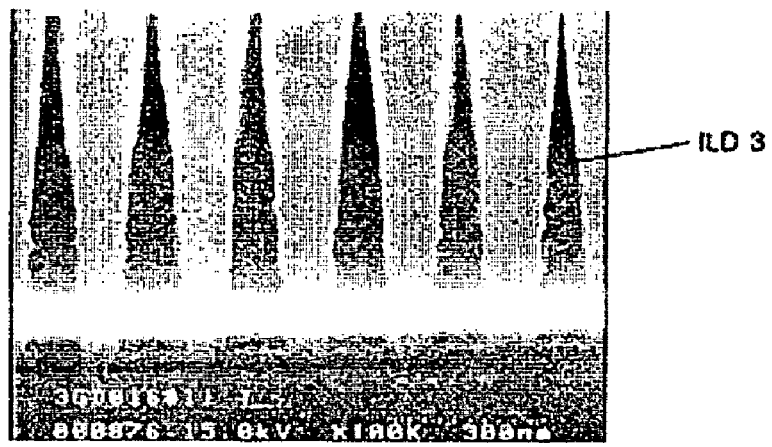
FIGS. 4A and 4B are photographs of SEM in a cross-sectional view for comparing a conventional SOG layer with a conventional APL layer obtained after a SAC etching process and wet cleaning process.
Figure 4B:
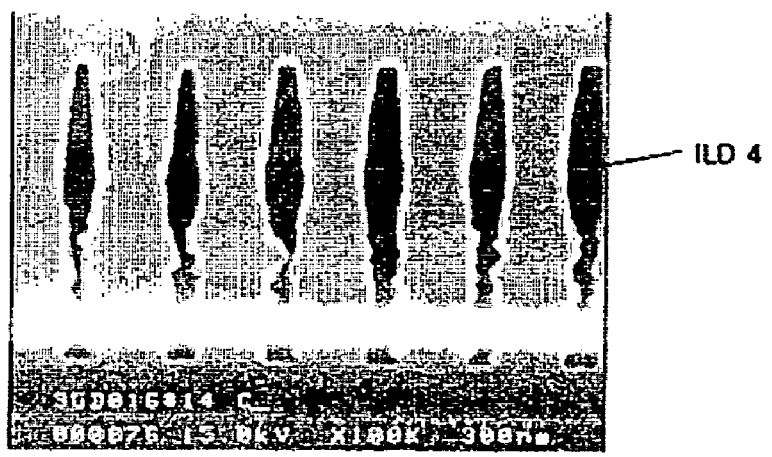
Figure 5A:
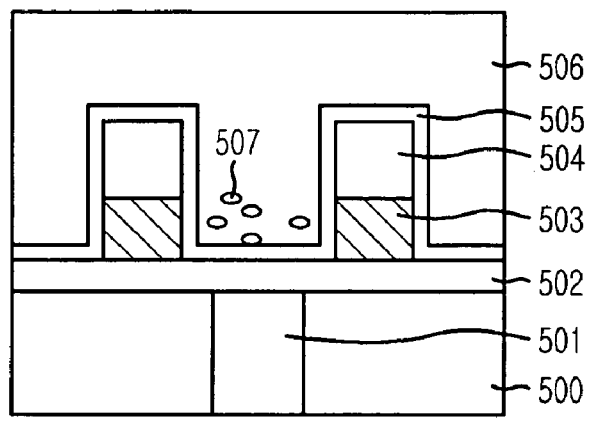
FIGS. 5A and 5B are cross-sectional views illustrating micro voids produced when depositing a conventional APL layer and punches on a bottom portion of the APL layer due to micro voids when an etching process is performed, respectively.
Figure 5B:
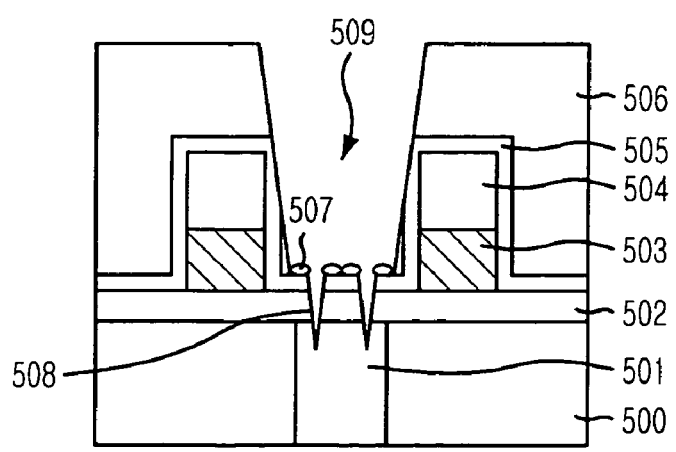
Figure 6:
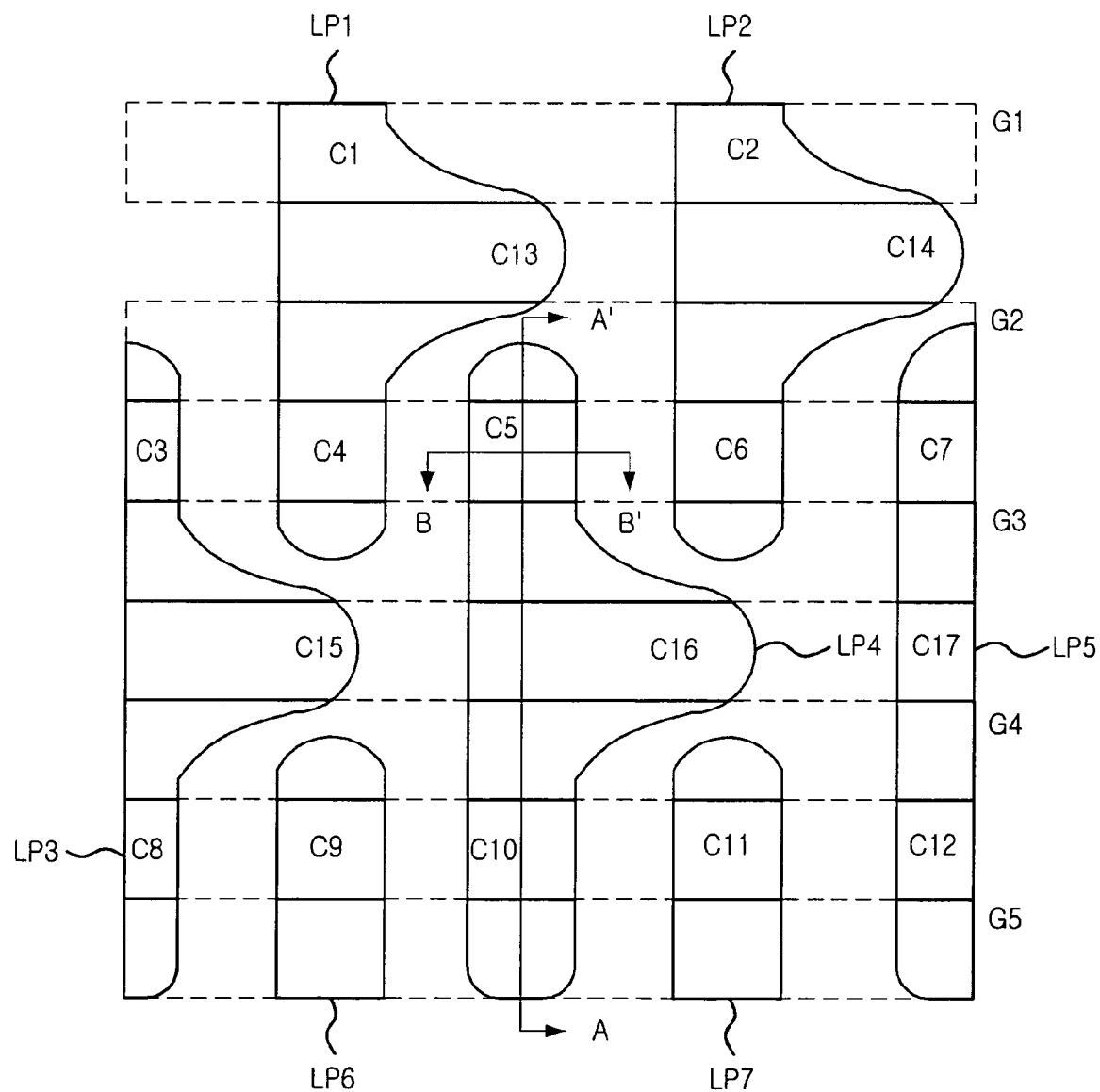
FIG. 6 is a diagram showing a layout of a semiconductor device obtained after a SAC etching process for forming a landing plug contact in accordance with a preferred embodiment of the present invention.

FIG. 6 is a diagram showing a layout of a semiconductor device obtained after a self-aligned contact (SAC) etching process.

As shown, a plurality of gate electrodes G1 to G5 is arranged in a uniform distance. In a crossing direction to the gate structures G1 to G5, a plurality of T-shape landing plugs LP1 to LP7 is formed by arranging a set of contact hole C1 to C17 in the form of T. Herein, the reference numerals from LP1 to LP7 represent a first to a seventh landing plugs, respectively. Each of the first to the seventh landing plugs LP1 to LP7 includes three contact holes. For instance, in the first landing plug LP1, contact holes for storage node contacts are denoted as C1 and C4, while a contact for a bit line contact is denoted as C13. That is, reference denotations C1 to C12 represent contact holes for storage node contacts, while reference denotations C13 to C17 represent contact holes for bit line contacts.

Meanwhile, although not illustrated, an inter-layer insulation layer is formed on the gate structures G1 to G5 disposed between each two of the first to the seventh landing plugs LP1 to LP7.

Hereinafter, detailed description on a method for forming a semiconductor device will be provided with reference to FIGS. 7A to 7E showing cross-sectional views of FIG. 6 taken along a direction of a line A-A' and a line B-B'.

FIGS. 7A to 7E are cross-sectional views illustrating a method for fabricating a semiconductor device in accordance with a preferred embodiment of the present invention. Although the preferred embodiment of the present invention exemplifies a contact hole for forming a landing plug contact, this contact hole can be employed in another methods for forming a metal wire contact, a bit line contact or a storage node contact of a capacitor contacting to an impurity junction region such as a source/drain junction and for forming a contact pad. Also, the same reference denotations are used for the gate structures G1 to G5.

Figure 7A:
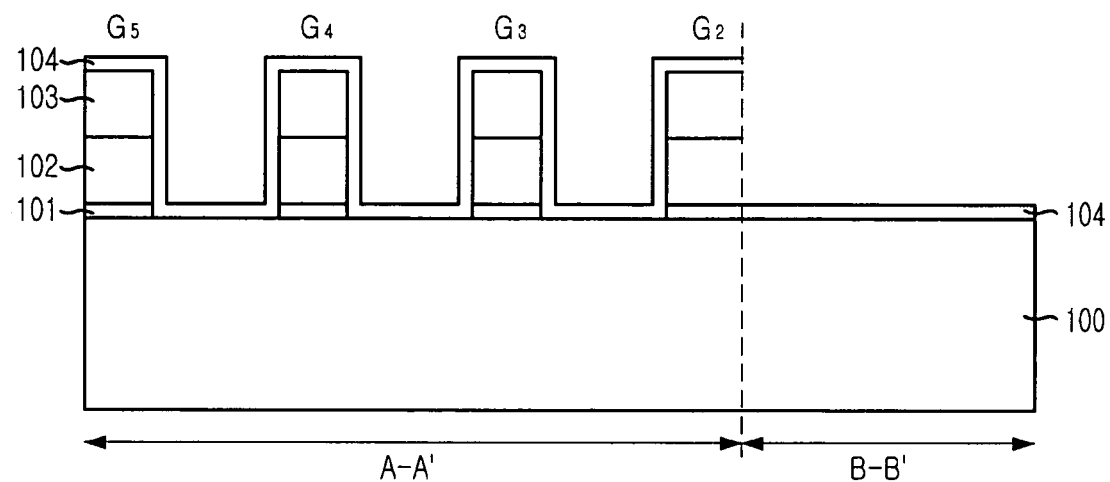
FIGS. 7A to 7E are cross-sectional views illustrating a method for forming a semiconductor device in accordance with a preferred embodiment of the present invention.

Referring to FIG. 7A, a plurality of gate structures G2 to G5 are formed by stacking a gate insulation layer 101, a gate conductive layer 102 and a gate hard mask 103, and on a substrate 100 provided with various device elements.

The gate insulation layer 101 is made of an oxide-based material such as silicon dioxide. The gate conductive layer 102 is made of a material selected from a group consisting of polysilicon, tungsten (W), tungsten nitride ($WN_x$), tungsten silicide ($WSi_x$). Also, it is possible to form the gate conductive layer 102 by using a material combining these listed materials.

The gate hard mask 103 serves to prevent the gate conductive layer 102 from being damaged during a process for forming a contact hole by etching an inter-layer insulation layer, which will be subsequently formed. Thus, the gate hard mask 103 is made of a material having a specific etch rate different from that of the inter-layer insulation layer. For instance, if the inter-layer insulation layer is made of an oxide-based material, the gate hard mask 103 is made of a nitride-based material such as silicon nitride (SiN) or silicon oxynitride (SiON). If the inter-layer insulation layer is made of a polymer-based low dielectric material, the gate hard mask 103 is made of an oxide-based material.

Although not illustrated, there are impurity diffusion regions such as source/drain junctions are formed in the substrate 100 disposed between each two of the gate structures G2 to G5.

More specific to the formation of the impurity diffusion regions, impurities are first implanted into the substrate 100 through an ion implantation process performed in alignment to the gate structures G2 to G5. A plurality of spacers is formed on sidewalls of the gate structure G2 to G5. Then, another ion implantation process is performed to form lightly doped drain (LDD) structures. Herein, more detailed descriptions on the respective ion-implantation processes for forming the LDD structures and the impurity diffusion regions and the spacer formation process are omitted.

Next, an etch stop layer 104 is formed on a surface of the above resulting structure. Herein, the etch stop layer 104 plays a role in preventing the substrate 100 from being damaged during a subsequent SAC etching process. At this time, it is preferable to form the etch stop layer 104 along a profile containing the gate structures G2 to G5. Also, the etch stop layer 104 is made of a nitride-based material such as silicon nitride or silicon oxynitride.

However, each of the gate structures G2 to G5 has a large aspect ratio, whereby the gap fill property of a material to be formed between the gate structures G2 to G5 becomes degraded. Therefore, the SOG layer 105 is employed for improving the gap fill property of the material to be formed on the etch stop layer 104 between the gate structures G2 to G5.

Figure 7B:
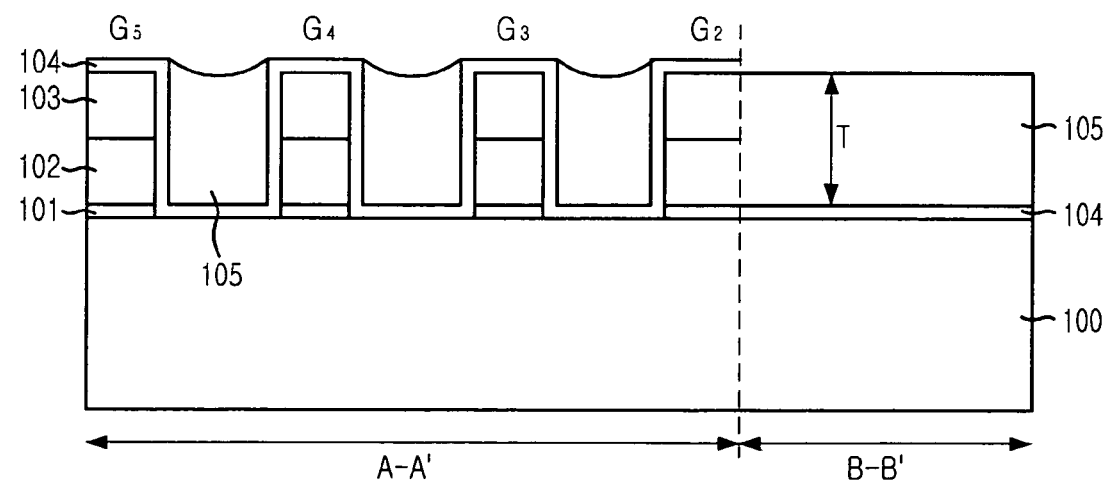

Referring to FIG. 7B, the SOG layer 105, which is a flowable insulation layer is formed on a top of the etch stop layer 104. As mentioned above, the SOG layer is spread through a spin coating method applied for improving the gap fill property due to an increase of the aspect ratio between the conductive patterns.

The SOG layer 105 should have a thickness 'T' which makes it possible to be cured up to the bottom portion of the SOG layer 105. To have the thickness 'T', the depositing thickness can be adjustable when forming the SOG layer 105 and a part of the SOG can be removed through the etching back process after depositing the SOG layer on sides of the structure.

There provide more explanations about the forming process of the SOG layer 105.

A silazane-based material having a molecular weight ranging from approximately 1,000 amu to approximately 10,000 amu is typically used for the SOD layer. The silazane has a structural formula of —(SiR1R2R3)n- and classified into perhydropolysilazane in which functional groups of R1, R2 and R3 are all hydrogens and organic polysilazane in which functional group of R1, R2 and R3 are respective organic atom groups such an alkyl group having about 1 to 8 of carbons, an aryl group and an alcoxyl group.

Also, a certain percentage by weight of polysilazane is contained in an organic solvent such as dibuthyl ether, toluene or xylene to be used as a coating material. Generally, SOG which is commonly called polysilazane can be applicable to a high thermal treatment compared with siloxane-based materials such as silicate and silsesquioxane. Therefore, it is possible for the above mentioned SOG to be securely applied with a curing process and thus to improve a tolerance to a wet etching/cleaning process. Also, manufacturing processes can be applicable more easily to the SOG layer than a hydrogen silsesquioxane (HSQ) layer.

A thickness of the SOG layer can be controlled by changing a weight ratio of solid dissolved in a solution of polysilazane and a speed of a spinner used in the coating process. For instance, under control of rotation numbers of a spinner in several hundreds to several thousands rounds per minute, approximately 20% by weight of solid polysilazane in a solution of dibuthyl ether is coated until a thickness of approximately 5,000 Å of the SOG layer is obtained.

After the polysilazane is coated, the solvent is removed through a bake process. The bake process can be one of a prebake process carrier out at a temperature ranging from approximately 80° C. to approximately 350° C., a hard bake carried out at a temperature around 400° C., and a combination thereof. Also, the bake process makes xylene and other compositions such as nitrogen and hydrogen discharged in a gaseous state from the SOG layer.

A thermal treatment is performed at a temperature of approximately 700° C. for approximately 10 minutes to approximately 60 minutes to discharge other components, and then, a curing process for forming a silicon oxide layer is performed at a temperature ranging from approximately 600° C. to approximately 700° C. for approximately 10 minutes to one hour. Herein, the curing process proceeds in an oxidizing atmosphere by supplying vapor to thereby make organic compositions of the coated polysilazane and other compositions except for the silicon discharged and subsequently form the silicon oxide layer through supply of oxygen. This curing process is repeated at least more than one to two times. At this time, examples of an ambient gas are water ($H_2O$), oxygen ($O_2$), nitrogen ($N_2$), hydrogen ($H_2$) and dinitrogen oxide ($N_2O$) which can be used singly or in combination. FIG. 7B is a cross-sectional view illustrating a process forming the SOG layer 105 completely cured up to the bottom portion of the SOG layer by the curing process.

By curing the bottom portion of the SOG layer 105, an etching tolerance is secured during a subsequent cleaning process and a large aspect ratio between the gate structures G2 to G5 improves the gap fill property of a material. It is also possible to basically prevent producing the micro voids when forming the APL layer.

Figure 7C:
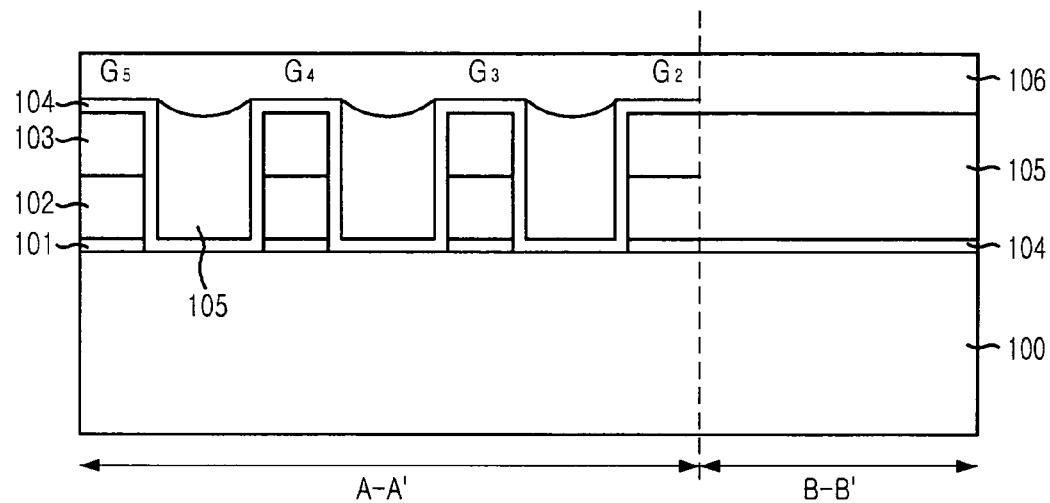

Next, as shown in FIG. 7C, the APL layer 106, one of the flowable insulation layers is formed on the SOG layer 105.

An APL layer 106 forming process will be described in detail.

The APL layer 106 uses $SiH_4$ and $H_2O_2$ as source gases. In a first step of forming the APL layer 106, a bottom part of the SOG layer 105 is treated with a plasma in order to promote adhesiveness and flow characteristics of the APL layer 106. At this time, this plasma treatment proceeds at a plasma enhanced chemical vapor deposition (PECVD) chamber with supply of $N_2O$ gas or $N_2$ gas. Also, the PECVD chamber is maintained with a pressure of approximately 400 mTorr and a power of approximately 500 W.

In a second step, the APL layer is deposited on the substrate structure based on gap filling and self-planarization characteristics of the APL layer 106. This deposition process proceeds at a low pressure (LP)-CVD chamber by using source gases of $SiH_4$ and $H_2O_2$. These source gases react with each other to form the APL layer 106 in which a group of hydrogen is attached to silicon oxide. This reaction is implemented as follows the following equation 1.

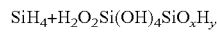

$$SiH_4 + H_2O_2 Si(OH)_4 SiO_xH_y.$$  Equation 1

In a third step, a furnace annealing process is performed in an atmosphere of $SiH_4$, $N_2O$ and/or $N_2$ to remove the group of hydrogen from the silicon oxide, thereby completing the formation of the APL layer 106.

As mentioned above, it is possible to prevent producing the micro voids not by forming the APL layer 106 on a narrow region such as between the gate electrode gates. Also, a good layer planarization, which is a special advantage of the APL layer 106, can be secured.

Figure 7D:
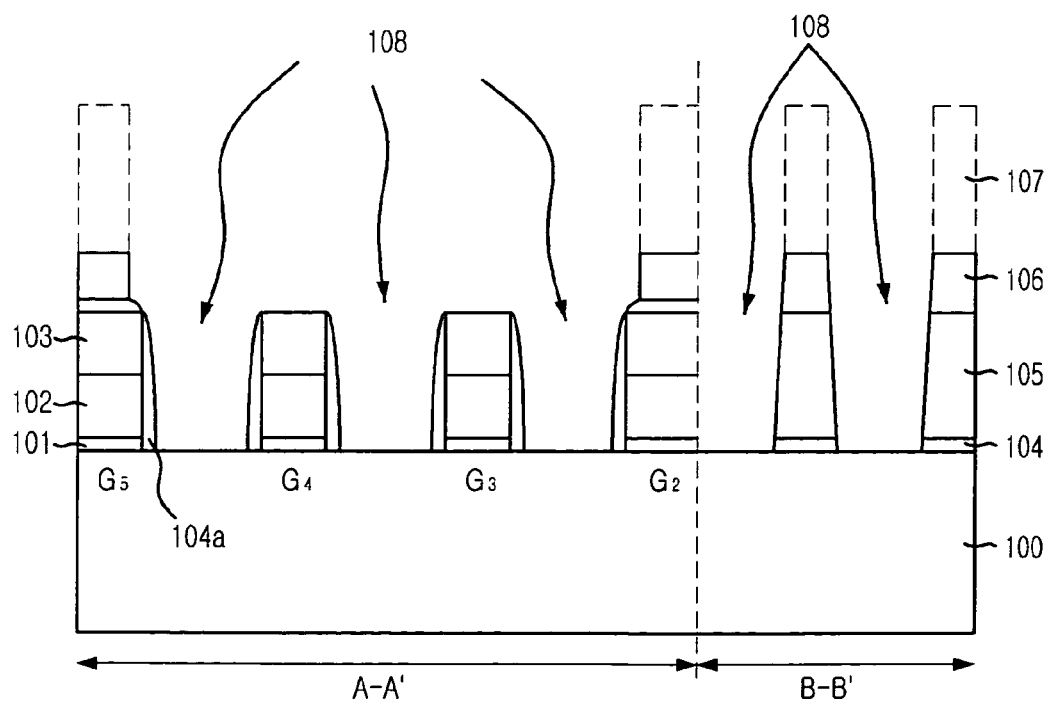

Referring to FIG. 7D, a photoresist is coated on the APL layer 106 by performing a spin coating method. Predetermined portions of the photoresist are selectively photo-exposed by employing a lithography device using a KrF, ArF or $F_2$ light source and a predecided reticle (not shown) for defining a width of a contact hole. Thereafter, a developing process proceeds by making a photo-exposed portion or a non-photo-exposed portion remain, and a cleaning process is then performed to remove etch remnants. After the photo-exposure and the developing processes, a photoresist pattern 107 for forming a landing plug contact (LPC) is formed.

Prior to forming the photoresist pattern 107, it is possible to form an anti-reflective coating (ARC) layer over the flowable insulation layer. The ARC layer prevents the formation of an undesired pattern caused by a light scattered at an interface between the photoresist pattern 107 and the APL layer 106 and improves adhesiveness of the photoresist pattern 107 with the flowable insulation layer. The ARC layer can be made of an organic-based material having a similar etch characteristic with the photoresist pattern 107.

A hard mask can be also formed between the APL layer 106 and the photoresist pattern 107 or between the APL layer 106 and the ARC layer. At this time, the hard mask can be made of a material such as a nitride-based insulation material or a conducting material such as tungsten and polysilicon.

The APL layer 106 is etched by performing a SAC etching process with use of the photoresist pattern 107 as an etch mask, thereby obtaining the APL layer 106. From this SAC etching process, a plurality of contact holes 108 exposing predetermined portions disposed between each two of the gate structures G2 to G5 are formed. At this time, the APL layer 106 and the SOG layer 105 are obtained by employing a typical recipe for the SAC etching process. That is, such a gas as $CF_4$, $C_4F_6$, $C_4F_8$, $CH_2F_2$ or $C_5F_8$ is mainly used along with an additional carrier gas such as He, Ne or Ar. After the SAC etching process, the photoresist pattern 107 is removed.

The substrate 100 which is an impurity diffusion region is disposed by removing the etch stop layer 104. At this time, each etch stop layer 104 is removed at each side of the gate electrode patterns (G2~G5) formed with the contact hole 108 and is remained as a spacer 104A. Next, when removing the photoresist pattern 107, a typical photoresist striping process is used. Subsequent to the blanket etch process, a wet cleaning process is performed by using a cleaning solution such as buffered oxide etchant (BOE) and hydrogen fluoride (HF) in order to remove etch remnants remaining after the SAC etching process and the blanket etch process and to secure a critical dimension (CD) of each bottom portion of the contact holes 108. At this time, it is preferable to perform the cleaning process for one to two hundreds seconds.

Because an etch tolerance is strengthened by completing the curing process up to the bottom portion of the SOG layer 105, the attack to the SOG layer 105 is not taken place. Also, because the micro voids are not produced due to the APL layer 106, the punch or the phenomenon that the contact is not opened is not happed.

It is preferable to use a solution of HF diluted with water in a ratio of approximately 50 to approximately 500 parts of water to approximately 1 part of HF.

On the other hand, it is possible to use a dry cleaning process. At this time, it is preferable to use a mixed plasma of inactive gases, i.e. mixing He, Ne, Ar, Xe into $HF_3$ or $N_2H_2$.

Figure 7E:
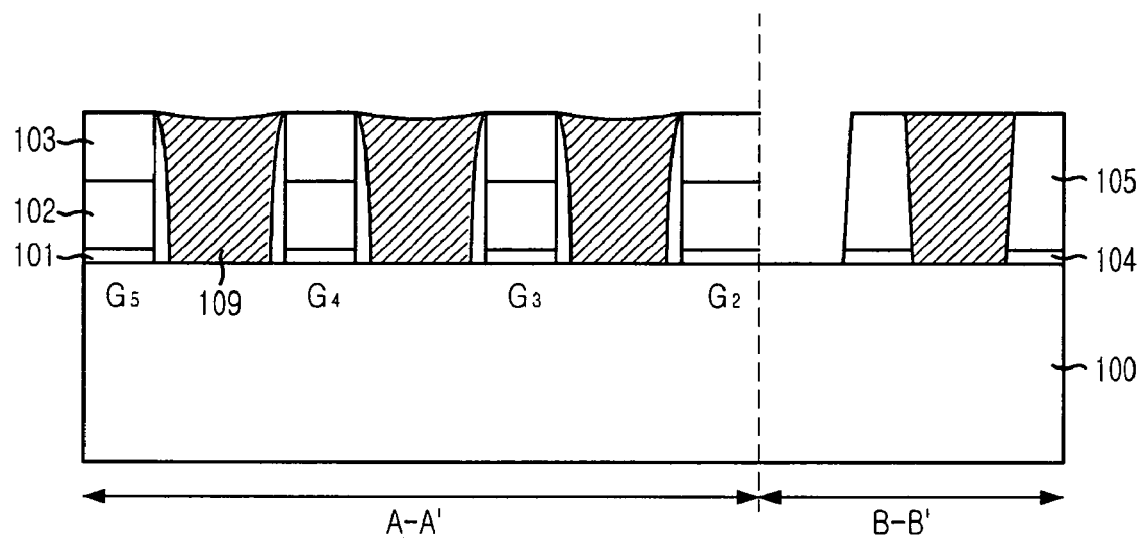

Referring to FIG. 7E, a conducting material for forming a plurality of plugs is completely filled into the contact holes 108, and then, a chemical mechanical polishing (CMP) process is performed until each gate hard mask 103 is exposed. After the CMP process, a plurality of plugs 109 is formed so as to be electrically connected to the respective impurity diffusion region.

Prior to performing the CMP process, the conducting material for forming the plugs 109 is subjected to an etch-back process for alleviating a difference in height between device elements in a cell region and a peripheral circuit region, whereby the CMP process can be easily applied.

The conducting material is typically polysilicon, and such a barrier metal layer as titanium (Ti) and titanium nitride (TiN) can be possibly stacked thereon. It is also possible to employ tungsten (W) as the conducting material. Recently, a selective epitaxial growth (SEG) method is frequently used to form the plugs 109.

As illustrated in the above, the flowable insulation layers, i.e. the SOG layer and the APL layer, are used as an interlayer insulation layer. That is, the SOG layer is formed with the thickness that the curing process can be exerted up to the very bottom portion of the SOG layer in a narrow bottom portion of the substrate and the APL layer is formed on the substrate.

In accordance with the preferred embodiment of the present invention, it is possible to overcome problems caused by producing the micro voids on the APL layer and a region that is not completely cured due to the property of the SOG layer.

Based on the preferred embodiment of the present invention, it is possible to overcome disadvantages of the flowable insulation layer, i.e. the APL layer and SOG layer, to be used as interlayer insulation layers by considering an arrangement of the APL layer and the SOG layer. As a result, it is possible to minimize defect generations which further improve yields of semiconductor devices.

Although the preferred embodiment of the present invention exemplifies the SAC etching process with use of the T-shape photoresist pattern, it is still possible to use line type or hole type photoresist patterns for the SAC etching process. Also, in addition to the contact opening process between the gate structures, the SAC etching process can be applied to a bit line opening process, i.e., a storage node contact hole formation process, and a via contact formation process.

The present application contains subject matter related to the Korean patent application No. KR 2003-0083168, filed in the Korean Patent Office on Nov. 21, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabrication of a semiconductor device, comprising the steps of:
   forming a plurality of conductive structure on a substrate;
   forming a spin-on-glass layer;
   curing the spin-on-glass layer;
   forming an advanced-planarization-layer on the spin-on-glass layer to form an insulation layer together with the spin-on-glass layer;
   forming a plurality of contact holes by selectively etching the advanced-planarization-layer and the spin-on-glass layer, thereby exposing portions of the substrate; and
   cleaning the contact holes and,
   the step of cleaning the contact holes is performed for approximately 10 seconds to approximately 200 seconds by using HF having a concentration in a ratio of approximately 50 to 500 parts of heavy water to 1 part of fluorine oxide in case of a BOE and HF.

2. The method of claim 1, wherein the step of forming the spin-on-glass layer includes the step of forming the spin-on-glass layer on the substrate formed with the conductive pattern and a step of removing a part of the spin-on-glass layer through an etching back process.

3. The method of claim 1, wherein the step of curing the spin-on-glass layer is performed at a temperature ranging from approximately 600° C. to approximately 700° C. for approximately 10 minutes to approximately 60 minutes in an atmosphere of a gas selected from a group consisting of water, oxygen, nitrogen, hydrogen and dinitrogen oxide.

4. The method of claim 1, wherein the step of forming the advanced planarization layer uses $SiH_4$ and $H_2O_2$ as a source gas.

5. The method of claim 1, after the step of forming the plurality of the conductive structure, further comprising:
   forming an etch stop layer of a nitride-based material along a profile formed in the conductive structure; and
   removing the etch stop layer after forming the contact holes.

6. The method of claim 1, after the step of cleaning, further comprising the step of forming a plurality of plugs each electrically connected to the exposed substrate.

7. The method of claim 6, wherein the step of forming the plurality of plugs includes the steps of:
   forming a conductive material to be electrically connected with the exposed substrate;
   removing a portion of the conductive material by performing an etch back process in order to reduce a height difference between different regions of the substrate; and
   forming the plurality of plugs isolated by polishing the conductive material with a target which the conductive structure is exposed.

8. The method of claim 6, wherein the step of forming the conductive material proceeds by employing a selective epitaxial growth method which grows the plug material from the exposed substrate.

9. The method of claim 6, wherein the step of forming the conductive material proceeds by depositing the material with a whole of the substrate.

10. The method of claim 1, wherein a photoresist pattern has a type selected among a T-shape, a line type and a hole type.

11. The method of claim 1, wherein the conductive structure includes one selected from the group consisting of a gate electrode pattern, a bit line pattern and a metal wire.

12. The method of claim 1, wherein the step of forming the plurality of contact holes proceeds by employing a self-aligned etching process.

13. The method of claim 1, wherein the spin on glass layer has an enough thickness to apply a curing process up to bottom portion on sides of the substrate including the conductive structure.

* * * * *